(12) United States Patent
Yamada et al.

(10) Patent No.: US 9,536,854 B2
(45) Date of Patent: Jan. 3, 2017

(54) BONDING WIRE FOR SEMICONDUCTOR DEVICE USE AND METHOD OF PRODUCTION OF SAME

(71) Applicants: Nippon Micrometal Corporation, Saitama (JP); Nippon Steel & Sumikin Materials Co., Ltd., Tokyo (JP)

(72) Inventors: Takashi Yamada, Saitama (JP); Daizo Oda, Saitama (JP); Ryo Oishi, Saitama (JP); Teruo Haibara, Saitama (JP); Tomohiro Uno, Tokyo (JP)

(73) Assignees: NIPPON MICROMETAL CORPORATION, Saitama (JP); NIPPON STEEL & SUMIKIN MATERIALS CO., LTD, Tokyo (JP)

( * ) Notice: Subject to any disclaimer, the term of this patent is extended or adjusted under 35 U.S.C. 154(b) by 0 days.

(21) Appl. No.: 14/893,833

(22) PCT Filed: Mar. 31, 2015

(86) PCT No.: PCT/JP2015/060035
§ 371 (c)(1),
(2) Date: Nov. 24, 2015

(87) PCT Pub. No.: WO2015/152191
PCT Pub. Date: Oct. 8, 2015

(65) Prior Publication Data
US 2016/0111389 A1    Apr. 21, 2016

(30) Foreign Application Priority Data
Mar. 31, 2014    (JP) .................................. 2014-072650

(51) Int. Cl.
*H01B 5/00* (2006.01)
*H01L 23/00* (2006.01)
(Continued)

(52) U.S. Cl.
CPC ................ *H01L 24/45* (2013.01); *B21C 1/00* (2013.01); *B21C 1/003* (2013.01);
(Continued)

(58) Field of Classification Search
CPC ....... B21C 1/00; B21C 1/003; B23K 35/0222; B23K 35/302; C22C 5/04; C22C 5/06; C22C 5/08; C22C 9/00; C22C 9/01; C22F 1/00; C22F 1/14; H01L 24/43; H01L 24/45; H01L 2224/4312; H01L 2224/4321; H01L 2224/4851; H01L 2224/05624; H01L 2224/43848; H01L 2224/43986; H01L 2224/45012; H01L 2224/45015; H01L 2224/45139; H01L 2224/45144; H01L 2224/45147; H01L 2224/45565; H01L 2224/45572; H01L 2224/45644; H01L 2224/45664; H01L 2224/45669; H01L 2224/45676;H01L 2224/45683; H01L 2224/48247; H01L 2224/48486; H01L 2224/48644; H01L 2224/48624; H01L 2224/48839; H01L 2224/48639; H01L 2224/45639; H01L 2224/48465; H01L 2224/85439; H01L 2224/85444; H01L 2224/85065; H01L 2224/85075; H01L 2224/85186; H01L 2224/85203; H01L 2224/85207; H01L 2924/181; H01L 2924/0102; H01L 2924/0105; H01L 2924/3025; H01L 2924/01004; H01L 2924/01005; H01L 2924/01006; H01L 2924/01007; H01L 2924/01014; H01L 2924/01013; H01L 2924/01015; H01L 2924/01018; H01L 2924/01022; H01L 2924/01023; H01L 2924/01024; H01L 2924/01027; H01L 2924/01028; H01L 2924/01032; H01L 2924/01033; H01L 2924/01045; H01L 2924/01044; H01L 2924/01047; H01L 2924/01078; H01L 2924/01079; H01L 2924/01083; H01L 2924/01082; H01L 2924/01203; H01L 2924/01327; H01L 2924/10253; H01L 2924/01029; H01L 2924/15311; H01L 2924/20111; H01L 2924/20108; H01L 2924/20751; H01L 2924/20752; H01L 2924/20754; H01L 2924/20753; Y10T 428/2913

(Continued)

(56) References Cited

U.S. PATENT DOCUMENTS 7,390,370 B2 *  6/2008  Uno .......................... C22C 5/02
                                                                 148/430
7,952,028 B2 *  5/2011  Uno ...................... B21C 37/047
                                                                 174/126.2

(Continued)

FOREIGN PATENT DOCUMENTS

JP        S62-048373        10/1987
JP        2002023618 A       1/2002
(Continued)

OTHER PUBLICATIONS

International Search Report dated Jun. 23, 2015, issued in corresponding PCT Application No. PCT/JP2015/060035, English-language translation provided.

*Primary Examiner* — Timothy Thompson
*Assistant Examiner* — Guillermo Egoavil
(74) *Attorney, Agent, or Firm* — Andrews Kurth Kenyon LLP

(57) ABSTRACT

Bonding wire for semiconductor device use where both leaning failures and spring failures are suppressed by (1) in a cross-section containing the wire center and parallel to the wire longitudinal direction (wire center cross-section), there are no crystal grains with a ratio a/b of a long axis "a" and a short axis "b" of 10 or more and with an area of 15 μm²

(Continued)

or more ("fiber texture"), (2) when measuring a crystal direction in the wire longitudinal direction in the wire center cross-section, the ratio of crystal direction <100> with an angle difference with respect to the wire longitudinal direction of 15° or less is, by area ratio, 50% to 90%, and (3) when measuring a crystal direction in the wire longitudinal direction at the wire surface, the ratio of crystal direction <100> with an angle difference with respect to the wire longitudinal direction of 15° or less is, by area ratio, 50% to 90%. During the drawing step, a drawing operation with a rate of reduction of area of 15.5% or more is performed at least once. The final heat treatment temperature and the pre-final heat treatment temperature are made predetermined ranges.

5 Claims, No Drawings

(51) Int. Cl.
  *B21C 1/00* (2006.01)
  *C22C 5/06* (2006.01)
  *C22C 5/08* (2006.01)
  *C22F 1/00* (2006.01)
  *C22F 1/14* (2006.01)
  *B23K 35/30* (2006.01)
  *B23K 35/02* (2006.01)

(52) U.S. Cl.
  CPC ...... *B23K 35/0227* (2013.01); *B23K 35/3006* (2013.01); *C22C 5/06* (2013.01); *C22C 5/08* (2013.01); *C22F 1/00* (2013.01); *C22F 1/14* (2013.01); *H01L 24/43* (2013.01); *H01L 2224/4321* (2013.01); *H01L 2224/43848* (2013.01); *H01L 2224/45012* (2013.01); *H01L 2224/45139* (2013.01); *H01L 2924/013* (2013.01); *H01L 2924/0103* (2013.01); *H01L 2924/0105* (2013.01); *H01L 2924/01022* (2013.01); *H01L 2924/01028* (2013.01); *H01L 2924/01029* (2013.01); *H01L 2924/01032* (2013.01); *H01L 2924/01046* (2013.01); *H01L 2924/01078* (2013.01); *H01L 2924/01079* (2013.01); *H01L 2924/201* (2013.01); *H01L 2924/2011* (2013.01); *H01L 2924/20108* (2013.01); *H01L 2924/20109* (2013.01); *H01L 2924/20111* (2013.01)

(58) Field of Classification Search
  USPC .. 174/126.1, 126.2, 102 R, 36, 120 R, 110 R
  See application file for complete search history.

(56) References Cited

U.S. PATENT DOCUMENTS

| | | | | |
|---|---|---|---|---|
| 8,299,356 B2* | 10/2012 | Uno | ........................ | C22C 5/02 |
| | | | | 174/110 R |
| 8,389,860 B2* | 3/2013 | Uno | .................. | B23K 35/0222 |
| | | | | 174/102 R |
| 2012/0118610 A1 | 5/2012 | Terashima | | |
| 2012/0263624 A1 | 10/2012 | Chiba | | |
| 2013/0171470 A1 | 7/2013 | Lee | | |
| 2016/0056025 A1* | 2/2016 | Kato | .................... | B22D 11/006 |
| | | | | 204/298.13 |

FOREIGN PATENT DOCUMENTS

| | | | | |
|---|---|---|---|---|
| JP | 2004228541 A | * | 8/2004 | |
| JP | 2010-167490 | | 8/2010 | |
| JP | 2011077254 | | 4/2011 | |
| JP | 4771562 | | 7/2011 | |
| JP | 2013039635 | | 7/2013 | |
| JP | 2014-053610 | | 3/2014 | |
| WO | WO 2014129745 A1 | * | 8/2014 | ............. B23K 35/30 |

* cited by examiner

BONDING WIRE FOR SEMICONDUCTOR DEVICE USE AND METHOD OF PRODUCTION OF SAME

CROSS REFERENCE TO RELATED APPLICATION(S)

This application is a national stage application of International Application No. PCT/JP2015/060035, filed Mar. 31, 2015, which is incorporated herein by reference it its entirety, and which claims the benefit of JP Application No. 2014-072650, filed on Mar. 31, 2014.

TECHNICAL FIELD

The present invention relates to bonding wire for semiconductor device use, more particularly relates to bonding wire for semiconductor device use which is comprised of Ag or Ag alloy, and a method of production of the same.

BACKGROUND ART

A semiconductor device is formed by mounting a semiconductor chip on a circuit wiring board (lead frame, board, tape, etc.) and connecting electrodes on the semiconductor chip and electrodes on the circuit wiring board by bonding wire for semiconductor device use (hereinafter, also simply referred to as "bonding wire").

As bonding wire for semiconductor device use, fine metal wire with a wire diameter of 20 to 50 μm or so is being used. One end of a bonding wire is formed into a ball by heating the tip of the wire to melt, then this ball part is press bonded on an electrode of the semiconductor chip by pressure bonding with ultrasonic and heat. The other end of the wire is bonded on an electrode of the circuit wiring board by pressure bonding with ultrasonic.

As the material for bonding wire, in the past, high purity Au (gold) or Au alloy has been used. However, Au is expensive, so another type of metal with a cheaper material cost is desired. As a low cost wire material other than Au, Cu (copper) is being studied. Compared with Au, Cu is more easily oxidized, so PLT 1 describes the example of a two-layer bonding wire comprised of a core material and a covering layer (outer layer) where Cu is used for the core material and Pd (palladium) is used for the covering layer. Further, PLT 2 discloses bonding wire which has a core material made of Cu or Cu alloy, a covering layer having Pd as its main ingredient at the surface of the core material, and an alloy layer which contains Au and Pd at the surface of the covering layer.

A Cu wire or Pd-coated Cu wire is high in hardness after bonding, so a material with a lower hardness is being demanded. As an element which has electrical conductivity equal to or better than Au and which is lower in hardness than Cu and, furthermore, which has oxidation resistance, Ag (silver) may be mentioned.

PLT 3 discloses an Ag—Au—Pd ternary alloy-based bonding wire mainly comprised of Ag. The bonding wire is heat treated for annealing before continuous die drawing, is drawn continuously by die drawing, then is heat treated for tempering, and is bonded by ball bonding in a nitrogen atmosphere. Due to this, even if used in a harsh environment of a high temperature, high humidity, or high pressure, it is considered possible to maintain bond reliability with aluminum pads.

PLT 4 discloses an Ag—Au, Ag—Pd, and Ag—Au—Pd alloy wire material comprised mainly of Ag. The center part of the alloy wire material contains elongated crystal grains or isometric crystal grains. The other parts of the alloy wire material are comprised of isometric crystal grains, so the crystal grains, including annealing twins, become 20% or more or the total. The objective is to improve the quality and reliability of the package products.

The distances between adjoining bonding wires have been made narrower, that is, the pitches have been made increasingly narrower. As demands on bonding wires corresponding to this, increased fineness, increased strength, loop control, improvement of bondability, etc. are being sought. Due to the higher density of mounting of semiconductors, the loop shapes are becoming increasingly complicated. Loop shapes are classified by loop height and bonding wire length (span) as parameters. In the latest semiconductors, in increasing cases, single packages contain high loops and low loops, short spans and long spans, and other opposite types of loops mixed together. Realizing this by a single type of bonding wire requires strict design of the material of the bonding wire.

As the properties of wire which is used in mass production, satisfying general properties like stability of loop control in the bonding step, improved bondability, suppressed wire deformation in the resin sealing step, and long term reliability of the bonded parts, for instance, has been desired so as to enable cutting edge demands for narrow pitch connection, multilayer chip connection, and other high density packaging technology.

CITATIONS LIST

Patent Literature

PLT 1: Japanese Patent Publication No. 2002-23618
PLT 2: Japanese Patent Publication No. 2011-77254A
PLT 3: Japanese Patent No. 4771562B2
PLT 4: Japanese Patent Publication No. 2013-139635A

SUMMARY OF INVENTION

Technical Problem

By increasing the pin count and narrowing the pitch, wire connections of different wire lengths and loop heights are being mixed in single ICs. If narrowing the pitch, leaning failures sometimes occur at the vertically standing parts of the wire from the ball bonds. A "leaning failure" is the phenomenon where the vertically standing part of a wire tips over near the ball bonding part and the distance with adjoining wires becomes closer. A wire material which alleviates leaning failures has been sought.

Further, in multilayer chip connection, sometimes spring failures become a problem. In connecting wires of multilayer chips, connections called "reverse bonding" where the bonding positions are reversed from those of usual wire bonding are often used. Reverse bonding is the technique of forming stud bumps on electrodes on a chip as a first step, bonding balls on the electrodes on a board as a second step, then bonding the wires on the stud bumps by wedge bonding. Due to this reverse bonding, the loop height is kept low and even if the layers of the chip are increased and the step difference becomes considerably high, stable loop control becomes possible. On the other hand, in this reverse bonding, spring failures where the bonding wire bends sometimes occur. In memory ICs, multilayer chips are becoming the mainstream. Reduction of such spring failures is hoped for.

Bonding wire of Ag or Ag alloy with an Ag content of 90 mass % or more (in this Description, sometimes referred to as "Ag or Ag alloy") (in this Description, sometimes referred to as "wire") is low in hardness, so hardly ever causes chip damage. For this reason, this wire is often used for reverse bonding. On the other hand, in reverse bonding, spring failures easily occur as explained above. Further, leaning failures easily occur due to the low hardness of Ag or Ag alloy wire.

In Ag or Ag alloy wire, while there have been means for alleviating either leaning failures or spring failures, simultaneous alleviation of leaning failures and spring failures has been difficult. The present invention has as its object to provide bonding wire for semiconductor device use which is comprised of Ag or Ag alloy which alleviates both leaning failures and spring failures and to provide a method of production of the same.

Solution to Problem

That is, the gist of the present invention lies in the following.
(1) Bonding wire for semiconductor device use with an Ag content of 90 mass % or more, wherein, in a wire center cross-section, which is a cross-section containing the wire center and parallel to the wire longitudinal direction (hereinafter, referred to as "wire center cross-section"), there are no crystal grains with a ratio a/b of a long axis "a" and a short axis "b" of 10 or more and with an area of 15 μm² or more (hereinafter, referred to as "fiber texture"),
when measuring a crystal direction in the wire longitudinal direction in the wire center cross-section, the ratio of crystal direction <100> with an angle difference with respect to the wire longitudinal direction of 15° or less is, by area ratio, 50% to 90%, and
when measuring a crystal direction in the wire longitudinal direction at the wire surface, the ratio of crystal direction <100> with an angle difference with respect to the wire longitudinal direction of 15° or less is, by area ratio, 50% to 90%.
(2) The bonding wire for semiconductor device use according to the above (1) wherein the bonding wire for semiconductor device use contains one or more of Pd, Cu, Au, Zn, Pt, Ge, Sn, Ti, and Ni, when containing Pd, Cu, Au, and Zn, contains these in a total of 0.01 mass % to 8 mass %, when containing Pt, Ge, Sn, Ti, and Ni, contains these in a total of 0.001 mass % to 1 mass %, and has a balance of Ag and impurities.
(3) The bonding wire for semiconductor device use according to the above (1) or (2), wherein S contained in the impurities is 1 mass ppm or less and Cl is 0.5 mass ppm or less.
(4) The method of production of bonding wire for semiconductor device use according to any one of the above (1) to (3), in which
the method has a drawing step which performs one or more drawing operations,
has, in the drawing step, at least one drawing operation which has a rate of reduction of area of 15.5 to 30.5%, and performs one or more operations of heat treatment in the middle of the drawing step and a final heat treatment after the end of the drawing step, wherein the temperature of the heat treatment right before the final heat treatment is 600° C. to 800° C. and the temperature of the final heat treatment is 300° C. to less than 600° C.

Advantageous Effects of Invention

The present invention provides Ag or Ag alloy bonding wire in which there is no fiber texture in the wire center cross-section, the cross-section <100> direction ratio is 50% to 90%, the surface <100> direction ratio is 50% to 90%, and therefore it is possible to obtain simultaneous alleviation of leaning failures and spring failures. By performing a drawing operation with a rate of reduction of area of 15.5 to 30.5% at least once during the drawing step, performing heat treatment after the end of the drawing step (final heat treatment), performing heat treatment one or more times during the drawing step, making the temperature of the heat treatment right before final heat treatment (pre-final heat treatment) 600° C. to 800° C., and making the temperature of the final heat treatment 300° C. to less than 600° C., it is possible to form the above crystal structure.

DESCRIPTION OF EMBODIMENTS

If differentiating the crystal structure which is seen in an Ag or Ag alloy bonding wire by the shapes at the observed surface, when defining the case where the angle difference of the adjoining crystal directions is 15 degrees or more as the "crystal grain boundary", it is possible to classify crystal grains into crystals of a shape with a ratio (a/b) of the long axis "a" and short axis "b" close to 1 and crystals of an elongated shape with a large value of a/b. A crystal with an a/b close to 1 is also called an "isometric crystal". Here, crystal grains with an a/b of 10 or more and an area of the crystal grains at the observed surface of 15 μm² or more is defined as a "fiber texture".

If observing an Ag or Ag alloy bonding wire at the cross-section including the wire center (wire center axis) and parallel to the wire longitudinal direction (in this Description, called the "wire center cross-section", that is, wire cross-section including wire center axis), the above defined fiber texture is often seen near the wire center axis. In PLT 4, the crystals called "elongated crystal grains 18" correspond to the fiber texture (see FIG. 1B in the literature). The parts other than the fiber textures are crystal grains with an a/b of close to 1.

The crystal structures which appear at the observed surface can be measured for <100> direction. If selecting the wire center cross-section as the observed surface and measuring the crystal direction in the wire longitudinal direction in the wire center cross-section, the ratio of the crystal direction <100> with an angle difference with respect to the wire longitudinal direction of 15° or less is expressed by the "area ratio" and called the "cross-section <100> direction ratio". Further, if selecting the wire surface as the observed surface and measuring the crystal direction in the wire longitudinal direction at the wire surface, the ratio of the crystal direction <100> with an angle difference with respect to the wire longitudinal direction of 15° or less is expressed by the area ratio and called the "surface <100> direction ratio".

In the present invention, when the Ag or Ag alloy bonding wire does not have a fiber texture at the wire center cross-section, has a cross-section <100> direction ratio of 50% to 90%, and has a surface <100> direction ratio of 50% to 90%, it is possible to suppress leaning failures and spring failures. Further, if making both the cross-section <100> direction ratio and surface <100> direction ratio 90% or less and simultaneously there is no fiber texture, spring failures can be suppressed. Further, if making the surface <100> direction ratio 50% or more, it is possible to suppress leaning failures. However, if the cross-section <100> direction ratio is less than 50%, leaning failures sometimes occur, so the cross-section <100> direction ratio was made 50% or more.

If there is a fiber texture at the wire center cross-section, parts with a fiber texture and parts without one will be formed in the longitudinal direction of the wire. At these portions, the breakage strength of the second bonding (wedge bonding) part differs, so the second bonding is not stable and spring failures sometimes occur. However, the present invention prevents the formation of the fiber texture and therefore can suppress the occurrence of spring failures.

The present invention makes both the cross-section <100> direction ratio and surface <100> direction ratio 50% to 90%. That is, when the two ratios are the same extent and certain ratios (90%) or less, the breakage strength of the second bonding is a suitable magnitude. Furthermore, there is less of a difference on micro portions, so there is greater resistance to spring failures.

Further, if the surface <100> direction ratio is too low, the ball neck part easily deforms in the horizontal direction, so leaning failures occur more easily, but by making the surface <100> direction ratio 50% or more, it is possible to suppress the occurrence of leaning failures.

The bonding wire is produced by the drawing operation. The drawing operation is an operation which passes the wire material through a round hole die one time or more to make the cross-sectional area of the material smaller. By preparing a material of wire diameter of several mm and repeating a cold drawing operation, the wire diameter successively becomes finer and a bonding wire of the targeted wire diameter is formed. Normally, the rate of reduction of area per pass (each time passed through the round hole die) is made 1 to 15%. Heat treatment is sometimes performed during the drawing step or after the end of the drawing step.

If using Ag or Ag alloy material to perform the usual drawing operation, a fiber texture is formed at the center of the wire. Further, by cold deformation at the drawing operation, the crystal direction of the wire surface is affected and the surface <100> direction ratio rises.

By heat treatment after the drawing operation, it is possible to eliminate the fiber texture at the wire center. However, if eliminating the fiber texture by heat treatment, over 800° C. high temperature heat treatment becomes necessary. As a result of heat treatment, the crystal direction of the crystals which form the wire become random, the surface <100> direction ratio falls, and it becomes difficult to realize a surface <100> direction ratio of 50% or more.

In the present invention, the rate of reduction of area of the drawing operation is specially designed and the pattern of heat treatment which is performed during the drawing step and after the end of the drawing step is limited. It is first by this that it was possible to prevent the formation of a fiber texture and simultaneously make the cross-section <100> direction ratio 50% to 90% and the surface <100> direction ratio 50% to 90%. Due to this, it was possible to suppress both leaning failures and spring failures.

That is, there is a drawing step of performing a drawing operation one time or more on an Ag or Ag alloy material. In the drawing step, a drawing operation which has a rate of reduction of area of 15.5 to 30.5% is performed at least one time. Furthermore, the heat treatment is performed one or more times during the drawing step and heat treatment is performed after the end of the drawing step as well (final heat treatment). By making the temperature of the heat treatment right before final heat treatment (pre-final heat treatment) 600° C. to 800° C. and making the temperature of the final heat treatment 300° C. to 600° C., it is possible to obtain Ag or Ag alloy bonding wire with no fiber texture at the wire center cross-section and with a surface <100> direction ratio and a cross-section <100> direction ratio in the preferable ranges of the present invention. By performing a drawing operation with a rate of reduction of area of 15.5 to 30.5% at least one time, it is possible to realize a crystal structure with less of a fiber texture than usual and make it easier to eliminate the fiber texture by later heat treatment. The final heat treatment temperature is made 300° C. or more because by doing this, it is possible to make the cross-section <100> direction ratio the upper limit of the present invention or less, while it is made less than 600° C. because by doing this, it is possible to make the cross-section <100> direction ratio the lower limit of the present invention or more. The pre-final heat treatment temperature is made 600° C. or more so as to make the wire as a whole recrystallize. It is made 800° C. or less to suppress local growth of large crystal grains.

The timing for performing the drawing operation with the rate of reduction of area of 15.5 to 30.5% is not particularly limited. It may be before or after the pre-final heat treatment. Preferably, it is made right before or right after the pre-final heat treatment.

Regarding the drawing operation after the pre-final heat treatment, the total rate of reduction of area and number of passes during that time are also not limited. Preferably, total rate of reduction of area is made 95% or less. By doing this, it is possible to obtain the desired crystal structure relatively easily by the final heat treatment.

Regarding the drawing operation which is performed before the pre-final heat treatment as well, the total rate of reduction of area and number of passes during that time are also not limited. Further, whether to perform the heat treatment before the pre-final heat treatment or not is also not limited. The heat treatment temperature etc. when performing heat treatment are also not particularly limited.

The bonding wire of the present invention can exhibit sufficient effect by using as a material Ag or Ag alloy with an Ag content of 90 mass % or more. If the Ag content is smaller than 90 mass %, the specific resistance becomes too high, and the result is not suitable for use as a bonding wire. As the composition other than Ag, chemical components which form solid solutions with Ag and make the wire resistant to breakage in the drawing step, for example, Pd, Cu, Au, Zn, Pt, Ge, Sn, Ti, and Ni may be contained.

The bonding wire of the present invention may further exhibit excellent effects by being made an Ag alloy which contains the following optional chemical components and has a balance of Ag and impurities.

As the method of evaluating the long-term reliability of the bonding wire, in addition to the most frequently used heating test, that is, evaluation of storage at a high temperature in a dry atmosphere, the general method of evaluation of heating at a high humidity, that is, a PCT test (pressure cooker test), is performed. Recently, as the method of evaluation of heating at a high humidity, a further severe HAST test (high accelerated temperature and humidity stress test) (temperature 130° C., relative humidity 85% RH, 5V) is used to prevent the occurrence of failures. In the present invention, by including in the composition of chemical components of the wire at least one of Pd, Cu, Au, and Zn in a total of 0.01 mass % or more, it is possible to obtain good results of evaluation of the heating at a high humidity in the HAST test. On the other hand, if the total of the contents of the Pd, Cu, Au, and Zn exceeds 8 mass %, the strength of the wire itself rises, so the breakage strength of the second bonding also rises and spring failures occur more easily, so the total content is made 8 mass % or less.

In the present invention, furthermore, by including in the composition of chemical components of the wire at least one of Pt, Ge, Sn, Ti, and Ni in a total of 0.001 mass % or more, the effect of improving the ball shape of the first bonding is obtained. On the other hand, if the total content of Pt, Ge, Sn, Ti, and Ni exceeds 1 mass %, the strength of the wire itself rises, so the breakage strength of the second bonding also rises and spring failures occur more easily, so preferably the total content is made 1 mass % or less.

In the present invention, furthermore, by making the content of S which is contained as an impurity in the wire 1 mass ppm or less and by making the content of Cl which is contained as an impurity 0.5 mass ppm or less, it is possible to obtain a good FAB shape of the first bonding.

The method of production of the bonding wire of the present invention is as explained before. That is, it performs a drawing operation using Ag or Ag alloy material which contains the chemical components of the present invention, performs a drawing operation with a rate of reduction of area of 15.5 to 30.5% at least once in the drawing step, performs heat treatment after the end of the drawing step (final heat treatment), performs heat treatment one or more times during the drawing step, makes the temperature of the pre-final heat treatment (heat treatment right before final heat treatment) 600° C. to 800° C., and makes the final heat treatment temperature 300° C. to 600° C. Due to this, it is possible to obtain Ag or Ag alloy bonding wire which has no fiber texture at the wire center cross-section, has a cross-section <100> direction ratio of 50% to 90%, and has a surface <100> direction ratio of 50% to 90%.

EXAMPLES

As the raw materials of the bonding wire, for the main component Ag, high purity material with a purity of 99.99 mass % or more was used, while for the raw materials of the additive elements Pd, Cu, Au, Zn, Pt, Ge, Sn, Ti, and Ni, materials with a purity of 99.9 mass % or more were used. Regarding the examples which contain the impurity elements S and Cl, S and Cl were deliberately contained.

After preparing the Ag or Ag alloy which contains the predetermined chemical components, it was continuously cast to obtain a material of a wire diameter of several mm, then was cold drawn by a die in a drawing operation and was heat treated. Regarding the rate of reduction of area of the drawing operation, in part of the invention examples and the comparative examples, a step making the rate of reduction of area 15.5 to 30.5% was added in 1 to 10 passes in the middle and the rate of reduction of area was made 5.5% to 15.0% in the other passes. A pass making the rate of reduction of area 15.5% or more was performed right after the pre-final heat treatment. The final wire diameter after the end of the drawing operation was made 15 to 25 µm.

As the heat treatment before and after drawing, final heat treatment performed after the end of the drawing step and pre-final heat treatment performed right before the final heat treatment in the heat treatment performed during the drawing step were performed. In the pre-final heat treatment, all of the invention examples and part of the comparative examples had a pre-final heat treatment temperature of 600° C. to 800° C. For the final heat treatment, all of the invention examples and part of the comparative examples had a final heat treatment temperature of 300° C. to less than 600° C. The total rate of reduction of area from the pre-final heat treatment to the end of drawing was made 80 to 90%.

[Analysis of Chemical Components Contained in Bonding Wire]

The concentration of the chemical components in the bonding wire (other than impurities) was measured by ICP-AES (Inductively coupled plasma atomic emission spectrometry), ICP-MS (Inductively coupled plasma mass spectrometry), etc. The concentration in the bonding wire was measured by GDMS (glow discharge mass spectrometry). "GDMS analysis" is the technique of generating a glow discharge in an Ar atmosphere using the sample as the cathode, sputtering the sample surface in plasma, and measuring the ionized component elements by a mass spectrometer.

[Crystal Structure of Bonding Wire]

Using the cross-section including the wire center and parallel to the wire longitudinal direction (wire center cross-section) and wire surface as observed surfaces, the crystal structure was evaluated. As the method of evaluation, the electron backscattered diffraction method (EBSD) was used. The EBSD method has the feature of observing the crystal direction of the observed surface and being able to illustrate the angle difference of crystal directions between adjoining measurement points and enables precise observation of the crystal direction while being relatively convenient even with fine wire such as bonding wire.

When covering a curved surface such as a wire surface, care is required when performing the EBSD method. If measuring a portion with large curvature, precise measurement becomes difficult. However, high precision measurement is possible by fastening the bonding wire which is used for measurement on a straight line on a flat surface and measuring the flat part near the center of the bonding wire. Specifically, it is sufficient to make the measurement region one such as follows. The size in the circumferential direction is made 50% or less of the wire diameter using the center of the wire longitudinal direction as the axis. The size in the wire longitudinal direction was made 100 µm or less. Preferably, if the size in the circumferential direction is made 40% or less of the wire diameter and the size in the wire longitudinal direction is made 40 µm or less, the measurement efficiency is raised by shortening the measurement time. Further, to raise the precision, it is preferable to measure three or more locations and obtain the average information considering variation. The measurement locations should be separated by 1 mm or more so as not to be in close proximity.

The cross-section <100> direction ratio and surface <100> direction ratio were calculated by measuring the crystal direction in the wire longitudinal direction using all crystal directions which can be identified by dedicated software (for example, OIM Analysis made by TSL Solutions etc.) as the base population and calculating the ratios (area ratio) of crystal directions <100> with angle differences of 15° or less from the wire longitudinal direction. In the fiber texture, dedicated software (for example, OIM Analysis made by TSL Solutions etc.) is used to calculate the ratio a/b of the long axis "a" and short axis "b" and the area of the crystal grains and evaluate the presence of a fiber texture in accordance with the definition.

[Leaning]

To an evaluation use lead frame, 100 wires were bonded by a loop length of 5 mm and a loop height of 0.5 mm. As the method of evaluation, the standing part of a wire was examined from the horizontal direction of the chip and the distance between the vertical line passing through the center of the ball bonding part and the standing part of the wire at the maximum time (leaning distance) was used for evaluation. If the leaning distance is smaller than the wire diameter, the leaning property is good, while if larger, the standing part is slanted, so the leaning property is judged to be poor. 100 bonded wires were examined under an optical microscope and the number of leaning failures were counted. Zero number of failures was evaluated as "VG" (very good), one to five as "G" (good), and six or more as "P" (poor).

[Spring]

To an evaluation use Si chip, 100 wires were bonded by a loop length of 2.5 mm and a loop height of 0.15 mm. To evaluate the spring property, the method of connection of bonding a bonding wire on a stud bump which was formed on an electrode by wedge bonding, that is, reverse bonding, was performed. The spring failures of bending of the bonding wires were examined. As the method of evaluation, 100 bonded wires were examined under an optical microscope and the number of spring failures were counted. Zero number of failures was evaluated as "VG" (very good), one to three as "G" (good), four to five as "F" (fair), and six or more as "P" (poor).

[HAST]

The HAST test was performed to evaluate the heating at a high humidity. A semiconductor device bonded by a wire bonder was allowed to stand in an environment of a temperature of 130° C., a humidity of 85% RH, and 5V and taken out every 48 hours. As the method of evaluation, the electrical resistance was measured. Samples with resistances which rose were ranked as NG (no good). A time until NG of 480 hours or more was evaluated as "VG" (very good), one of 384 hours to less than 480 hours was evaluated as "G" (good), one of 288 hours to less than 384 hours was evaluated as "F" (fair), and one of less than 288 hours was evaluated as "P" (poor).

[FAB Off-Centeredness]

The FAB shape of the first bonding was evaluated. 100 FABs were prepared at the evaluation lead frame by a wire bonder. As the method of evaluation, 100 FABs were examined by an SEM (scanning electron microscope). Ones close to perfect circles were ranked as OK and ones with off-centered shapes and shrinked shapes were ranked as NG. The numbers of OK and NG were counted. Zero NGs was ranked as "VG" (very good), one to five NGs as "G" (good), six to 10 as "F" (fair), and 11 or more as "P" (poor).

[Bonded Ball Shape]

The ball shape of the first bonding was evaluated. 100 wires were bonded to the evaluation Si chip by a wire bonder. As the method of evaluation, 100 bonded ball parts were examined by an optical microscope. Ones close to perfect circles were ranked as OK and ones with flowery shapes were ranked as NG. The numbers of OK and NG were counted. Zero NGs was ranked as "VG" (very good), one to five NGs as "G" (good), six to 10 as "F" (fair), and 11 or more as "P" (poor).

In each of the above evaluations as well, "VG" (very good), "G" (good), and "F" (fair) were considered passing and only "P" (poor) was considered as failing.

The results are shown in Table 1. Values and items outside the scope of the present invention are underlined.

Invention Examples 1 to 43 contain chemical components in the scope of the present invention and are obtained by performing a drawing operation with a rate of reduction of area of 15.5 to 30.5% one time during the drawing step, making the temperature of the pre-final heat treatment 600° C. to 800° C., and making the temperature of the final heat treatment 300° C. to less than 600° C. As a result, it was possible to prevent the formation of a fiber texture, simultaneously make the cross-section <100> direction ratio 50% to 90%, and make the surface <100> direction ratio 50% to 90%.

The invention examples comprised of wires with compositions of chemical components including one or more of Pd, Cu, Au, and Zn in a total of 0.01 mass % or more enabled "G" (good) or "VG" (very good) results to be obtained in HAST tests and gave particularly good results. The invention examples comprised of wires with compositions of chemical components including one or more of Pt, Ge, Sn, Ti, and Ni in a total of 0.001 mass % or more enabled "G" (good) or "VG" (very good) bonded ball shapes and gave particularly good results. The invention examples comprised of wires with impurities of an S content of 1 mass ppm or less and a Cl content of 0.5 mass ppm or less had a "G" (good) or "VG" (very good) FAB shape and gave good results.

Comparative Examples 44 and 45 had no operation with a rate of reduction of area of 15.5% or more in the drawing step, had a fiber texture in the wire, and was ranked poor in evaluation of spring failures. Comparative Example 46 had a low final heat treatment temperature, so had a cross-section <100> direction ratio above the upper limit and was ranked poor in evaluation of spring failures. Comparative Example 47 had a high final heat treatment temperature, so had a cross-section <100> direction ratio below the lower limit, had a surface <100> direction ratio of less than 70%, and was ranked poor in evaluation of leaning failures. Comparative Example 48 had a low pre-final heat treatment temperature and high final heat treatment temperature, so had both a cross-section <100> direction ratio and a surface <100> direction ratio below the lower limits and was ranked poor in evaluation of leaning failures. Comparative Example 49 had a low pre-final heat treatment temperature, had no operation of a rate of reduction of area of 15.5% or more in the drawing step, had a low surface <100> direction ratio, had a fiber texture, and had spring failures and leaning failures. Comparative Example 50 had a low pre-final heat treatment temperature and a low final heat treatment temperature, so had a high surface <100> direction ratio and was ranked poor in evaluation of spring failures. Comparative Example 51 had a low pre-final heat treatment temperature and a low final heat treatment temperature and furthermore had no operation of a rate of reduction of area of 15.5% or more in the drawing step, had both a cross-section <100> direction ratio and a surface <100> direction ratio above the upper limits, had a fiber texture, and was ranked poor in evaluation of spring failures.

TABLE 1

|  | No. | Wire dia. μm | Cross-section <100> direction rate Area | Surface <100> direction rate Area | Fiber texture | Ag | Pd | Cu | Au | Zn | Pt | Ge |
|---|---|---|---|---|---|---|---|---|---|---|---|---|
|  |  |  |  |  |  |  | mass % |  |  |  |  |  |
| Inv. ex. | 1 | 15 | 80 | 70 | None | Bal. | 2.0 |  |  |  | 0.05 |  |
|  | 2 | 15 | 72 | 77 | None | Bal. | 3.5 |  |  |  |  | 0.01 |
|  | 3 | 15 | 67 | 67 | None | Bal. | 1.7 |  |  |  | 0.22 |  |

TABLE 1-continued

|  | No. | | | | | | | | | | |
|---|---|---|---|---|---|---|---|---|---|---|---|
|  | 4 | 15 | 50 | 88 | None | Bal. | 1.6 | | | 0.33 | |
|  | 5 | 18 | 71 | 82 | None | Bal. | 1.1 | | 0.81 | 0.11 | |
|  | 6 | 18 | 52 | 55 | None | Bal. | | 2.1 | | 0.007 | |
|  | 7 | 18 | 81 | 71 | None | Bal. | | 5.5 | | | |
|  | 8 | 18 | 74 | 53 | None | Bal. | 0.7 | 0.5 | | 0.33 | |
|  | 9 | 18 | 67 | 85 | None | Bal. | 2.2 | | 0.8 | 0.41 | 0.005 |
|  | 10 | 18 | 74 | 70 | None | Bal. | 1.9 | 0.5 | | 0.12 | |
|  | 11 | 18 | 66 | 62 | None | Bal. | 2.1 | 0.7 | 3.1 | | 0.009 |
|  | 12 | 18 | 81 | 74 | None | Bal. | 0.5 | 0.3 | | 0.82 | |
|  | 13 | 18 | 63 | 73 | None | Bal. | 2.2 | | | 0.38 | |
|  | 14 | 18 | 89 | 80 | None | Bal. | 3.5 | | | | 0.01 |
|  | 15 | 18 | 70 | 75 | None | Bal. | | | 1.8 | 0.3 | |
|  | 16 | 18 | 82 | 77 | None | Bal. | | 1.7 | | 0.33 | |
|  | 17 | 18 | 72 | 83 | None | Bal. | 1.8 | | | | |
|  | 18 | 20 | 70 | 87 | None | Bal. | 2.1 | 0.5 | | | 0.22 |
|  | 19 | 20 | 77 | 80 | None | Bal. | | | 0.8 | | |
|  | 20 | 20 | 65 | 82 | None | Bal. | 0.8 | | | | |
|  | 21 | 20 | 66 | 76 | None | Bal. | 4.4 | 0.8 | | 0.21 | 0.07 |
|  | 22 | 20 | 71 | 75 | None | Bal. | 4.2 | 1.2 | | 0.33 | |
|  | 23 | 20 | 80 | 77 | None | Bal. | 1.3 | | | | 0.31 |
|  | 24 | 20 | 82 | 74 | None | Bal. | | | 3.1 | | 0.80 |
|  | 25 | 20 | 88 | 75 | None | Bal. | | 0.7 | | 0.22 | |
|  | 26 | 20 | 77 | 67 | None | Bal. | 2.2 | 0.1 | | 0.39 | |
|  | 27 | 23 | 60 | 80 | None | Bal. | 2.2 | | 0.1 | 0.007 | |
|  | 28 | 23 | 64 | 84 | None | Bal. | 1.8 | | | 0.05 | |
|  | 29 | 23 | 65 | 80 | None | Bal. | | | 2.1 | | 0.15 |
|  | 30 | 23 | 71 | 71 | None | Bal. | 1.3 | | | 0.15 | |
|  | 31 | 25 | 89 | 88 | None | Bal. | 1.3 | | | | 0.22 |
|  | 32 | 25 | 80 | 68 | None | Bal. | 1.7 | 0.5 | | | |
|  | 33 | 25 | 52 | 87 | None | Bal. | | | 2.2 | 0.22 | |
|  | 34 | 25 | 65 | 67 | None | Bal. | | | | 1.8 | |
|  | 35 | 25 | 70 | 82 | None | Bal. | 3.1 | | 1.1 | | 0.06 |
|  | 36 | 20 | 71 | 68 | None | Bal. | | | | | |
|  | 37 | 20 | 61 | 83 | None | Bal. | | | | | |
|  | 38 | 20 | 65 | 81 | None | Bal. | 0.5 | | | | |
|  | 39 | 20 | 78 | 82 | None | Bal. | 0.8 | 0.7 | 0.2 | | |
|  | 40 | 20 | 77 | 80 | None | Bal. | | | | | |
|  | 41 | 20 | 75 | 72 | None | Bal. | 4.4 | | | 0.005 | |
|  | 42 | 20 | 68 | 68 | None | Bal. | | 3.3 | | 0.007 | 0.006 |
|  | 43 | 20 | 74 | 84 | None | Bal. | 5.2 | | 2.2 | 1.0 | 0.73 |
| Comp. Ex. | 44 | 18 | 88 | 86 | Yes | Bal. | 3.5 | | | 0.07 | |
|  | 45 | 18 | 75 | 76 | Yes | Bal. | 1.1 | 0.5 | | | |
|  | 46 | 20 | 95 | 85 | None | Bal. | | 2.2 | | 0.12 | 0.02 |
|  | 47 | 20 | 41 | 61 | None | Bal. | | 1.2 | | 0.12 | |
|  | 48 | 20 | 33 | 35 | None | Bal. | 0.007 | | | | |
|  | 49 | 20 | 82 | 48 | Yes | Bal. | 7.2 | 1.7 | | 0.22 | |
|  | 50 | 23 | 58 | 93 | None | Bal. | 2.2 | 0.4 | | 0.15 | |
|  | 51 | 23 | 94 | 98 | Yes | Bal. | 2.6 | | | | 0.09 |

|  | No. | Sn mass % | Ti mass % | Ni mass % | S mass ppm | Cl mass ppm | Spring | Leaning | HAST | Bonded ball shape | FAB shape |
|---|---|---|---|---|---|---|---|---|---|---|---|
| Inv. ex. | 1 | | | | <0.01 | <0.01 | VG | VG | VG | VG | VG |
|  | 2 | | | | <0.01 | <0.01 | VG | VG | VG | VG | VG |
|  | 3 | 0.20 | | | <0.01 | <0.01 | VG | VG | VG | VG | VG |
|  | 4 | | | | <0.01 | <0.01 | VG | G | VG | VG | VG |
|  | 5 | | | | <0.01 | <0.01 | VG | VG | VG | VG | VG |
|  | 6 | | | | <0.01 | 0.1 | VG | G | VG | G | VG |
|  | 7 | 0.008 | | | <0.01 | <0.01 | VG | VG | VG | G | VG |
|  | 8 | | | | <0.01 | <0.01 | VG | G | VG | VG | VG |
|  | 9 | | | | 0.7 | 0.4 | VG | VG | VG | VG | G |
|  | 10 | 0.005 | | | <0.01 | <0.01 | VG | VG | VG | VG | VG |
|  | 11 | | | | 0.2 | <0.01 | VG | VG | VG | G | VG |
|  | 12 | | | | <0.01 | <0.01 | VG | VG | G | VG | VG |
|  | 13 | | | | <0.01 | <0.01 | VG | VG | VG | VG | VG |
|  | 14 | | | | 0.7 | <0.01 | G | VG | VG | VG | G |
|  | 15 | | 0.04 | | <0.01 | <0.01 | VG | VG | VG | VG | VG |
|  | 16 | | | 0.11 | <0.01 | <0.01 | VG | VG | VG | VG | VG |
|  | 17 | 0.15 | 0.07 | 0.22 | <0.01 | <0.01 | VG | VG | VG | VG | VG |
|  | 18 | | | | <0.01 | <0.01 | G | VG | VG | VG | VG |
|  | 19 | 0.70 | | | <0.01 | 0.4 | VG | G | VG | VG | G |
|  | 20 | 0.12 | | | <0.01 | <0.01 | VG | G | VG | VG | VG |
|  | 21 | | | | <0.01 | <0.01 | VG | VG | VG | VG | VG |
|  | 22 | 0.06 | | | <0.01 | <0.01 | VG | VG | VG | VG | VG |
|  | 23 | 0.33 | | | <0.01 | <0.01 | VG | VG | VG | VG | VG |
|  | 24 | | | | <0.01 | <0.01 | VG | VG | VG | VG | VG |
|  | 25 | | | | <0.01 | <0.01 | G | VG | G | VG | VG |
|  | 26 | | | | 0.5 | <0.01 | VG | VG | VG | VG | VG |
|  | 27 | | | | <0.01 | 0.3 | VG | VG | VG | G | VG |

TABLE 1-continued

|  |  |  |  |  |  |  |  |  |  |
|---|---|---|---|---|---|---|---|---|---|
|  | 28 |  |  |  | <0.01 | <0.01 | VG | VG | VG | VG | VG |
|  | 29 |  |  |  | <0.01 | <0.01 | VG | VG | VG | VG | VG |
|  | 30 |  |  |  | 1.0 | <0.01 | VG | VG | VG | VG | G |
|  | 31 |  |  |  | <0.01 | <0.01 | G | VG | VG | VG | VG |
|  | 32 | 0.07 |  |  | <0.01 | <0.01 | VG | VG | VG | VG | VG |
|  | 33 |  |  |  | <0.01 | 0.5 | VG | G | VG | VG | G |
|  | 34 |  |  |  | <0.01 | <0.01 | VG | VG | VG | F | VG |
|  | 35 |  |  |  | <0.01 | <0.01 | VG | VG | VG | VG | VG |
|  | 36 |  |  |  | <0.01 | <0.01 | VG | VG | F | F | VG |
|  | 37 |  |  |  | <0.01 | <0.01 | VG | VG | F | F | VG |
|  | 38 |  |  |  | <0.01 | <0.01 | VG | VG | G | F | VG |
|  | 39 |  |  |  | <0.01 | <0.01 | VG | VG | VG | F | VG |
|  | 40 | 0.4 |  |  | <0.01 | <0.01 | VG | VG | F | VG | VG |
|  | 41 |  |  |  | 1.2 | <0.01 | VG | VG | VG | G | F |
|  | 42 | 0.004 |  |  | <0.01 | 0.8 | VG | VG | VG | VG | F |
|  | 43 |  | 0.33 |  | <0.01 | <0.01 | F | VG | VG | VG | VG |
| Comp. Ex. | 44 |  |  |  | <0.01 | <0.01 | P | VG | VG | VG | VG |
|  | 45 |  |  |  | <0.01 | <0.01 | P | VG | VG | F | VG |
|  | 46 | 0.02 |  |  | <0.01 | <0.01 | P | VG | VG | VG | VG |
|  | 47 | 0.001 |  |  | <0.01 | 1.2 | VG | P | VG | VG | F |
|  | 48 |  |  |  | <0.01 | <0.01 | VG | P | F | F | VG |
|  | 49 |  |  |  | <0.01 | <0.01 | P | P | VG | VG | VG |
|  | 50 |  |  |  | 1.4 | <0.01 | P | VG | VG | VG | F |
|  | 51 |  |  |  | <0.01 | <0.01 | P | VG | VG | VG | VG |

INDUSTRIAL APPLICABILITY

The present invention can be utilized for semiconductors.

The invention claimed is:

1. Bonding wire for semiconductor device use with an Ag content of 90 mass % or more,
    wherein, in a wire center cross-section, which is a cross-section containing the wire center and parallel to the wire longitudinal direction, there are no crystal grains with a ratio a/b of a long axis "a" and a short axis "b" of 10 or more and with an area of 15 µm$^2$ or more,
    when measuring a crystal direction in the wire longitudinal direction in said wire center cross-section, the ratio of crystal direction <100> with an angle difference with respect to said wire longitudinal direction of 15° or less is, by area ratio, 50% to 90%, and
    when measuring a crystal direction in the wire longitudinal direction at the wire surface, the ratio of crystal direction <100> with an angle difference with respect to said wire longitudinal direction of 15° or less is, by area ratio, 50% to 90%.

2. The bonding wire for semiconductor device use according to claim 1,
    wherein said bonding wire for semiconductor device use contains one or more of Pd, Cu, Au, Zn, Pt, Ge, Sn, Ti, and Ni,
    when containing Pd, Cu, Au, and Zn, contains these in a total of 0.01 mass % to 8 mass %,
    when containing Pt, Ge, Sn, Ti, and Ni, contains these in a total of 0.001 mass % to 1 mass %, and
    has a balance of Ag and impurities.

3. The bonding wire for semiconductor device use according to claim 1 or 2,
    wherein S contained in said impurities is 1 mass ppm or less and Cl is 0.5 mass ppm or less.

4. A method of production of bonding wire for semiconductor device use according to claim 1 or 2, in which the method has a drawing step which performs one or more drawing operations,
    has, in the drawing step, at least one drawing operation which has a rate of reduction of area of 15.5% to 30.5%, and
    performs one or more operations of heat treatment in the middle of the drawing step and a final heat treatment after the end of the drawing step,
    wherein the temperature of the heat treatment right before the final heat treatment is 600° C. to 800° C. and the temperature of the final heat treatment is 300° C. to less than 600° C.

5. A method of production of bonding wire for semiconductor device use according to claim 3, in which the method has a drawing step which performs one or more drawing operations,
    has, in the drawing step, at least one drawing operation which has a rate of reduction of area of 15.5% to 30.5%, and
    performs one or more operations of heat treatment in the middle of the drawing step and a final heat treatment after the end of the drawing step,
    wherein the temperature of the heat treatment right before the final heat treatment is 600° C. to 800° C. and the temperature of the final heat treatment is 300° C. to less than 600° C.

* * * * *